United States Patent [19]

Cuomo et al.

[11] Patent Number: 4,541,890
[45] Date of Patent: Sep. 17, 1985

[54] HALL ION GENERATOR FOR WORKING SURFACES WITH A LOW ENERGY HIGH INTENSITY ION BEAM

[75] Inventors: Jerome J. Cuomo, Lincolndale, N.Y.; Harold R. Kaufman, Fort Collins, Colo.

[73] Assignee: International Business Machines Corporation, Armonk, N.Y.

[21] Appl. No.: 654,045

[22] Filed: Sep. 24, 1984

Related U.S. Application Data

[63] Continuation of Ser. No. 584,304, Mar. 5, 1984, abandoned, which is a continuation of Ser. No. 383,919, Jun. 1, 1982, abandoned.

[51] Int. Cl.⁴ .............................................. C23C 15/00
[52] U.S. Cl. ................................. 156/345; 156/643; 156/646; 204/164; 204/192 E; 204/298; 313/361.1; 313/362.1; 315/111.81; 315/111.91
[58] Field of Search .................. 156/643, 646, 345; 204/192 E, 192 N, 164, 298; 313/361.1, 361.2; 315/111.81, 111.91

[56] References Cited

U.S. PATENT DOCUMENTS

| | | |
|---|---|---|
| 2,209,669 | 7/1940 | Borries et al. |
| 2,847,581 | 8/1958 | Clark |
| 3,309,873 | 3/1967 | Cann |
| 3,346,736 | 10/1967 | Neuhaus |
| 3,388,291 | 6/1968 | Cann |
| 3,585,546 | 6/1971 | Yanaka et al. |
| 3,613,370 | 10/1971 | Paine |
| 3,707,628 | 12/1972 | Bassett et al. |
| 3,870,891 | 3/1975 | Mulvey |
| 3,913,320 | 10/1975 | Reader et al. |
| 3,956,666 | 5/1976 | Reader et al. |
| 3,969,646 | 7/1976 | Reader |
| 4,028,579 | 6/1977 | King |
| 4,119,881 | 10/1978 | Calderon .............. 204/192 E |
| 4,158,589 | 6/1979 | Keller et al. |
| 4,215,187 | 7/1980 | Mourier ................ 315/111.81 |
| 4,259,145 | 3/1981 | Harper et al. ............ 156/345 |
| 4,277,304 | 7/1981 | Horiike et al. .......... 156/345 |
| 4,351,712 | 9/1982 | Cuomo et al. ......... 204/192 E |
| 4,361,472 | 11/1982 | Morrison et al. ....... 204/298 |

OTHER PUBLICATIONS

Kaufman, "Technology of Closed-Drift Thrusters", AIAN/SAF/ASME, 19th Joint Conference, Jun. 27-29, 1983, pp. 1-13.
"Technology . . . Sputtering" J. Vacuum Science Tech. (3/78) pp. 272-276.
"Anomalous . . . Plasma" Physics of Fluids, (6/66) pp. 1115-1123.
"Further . . . Accelators" AIAA Journal, (5/70) pp. 873-879.

*Primary Examiner*—Jerome Massie
*Attorney, Agent, or Firm*—Pollock, Vande Sande & Priddy

[57] ABSTRACT

Apparatus and method for generating low energy, high intensity ion beams. A Hall current ion source is provided to conduct many integrated circuit fabrication processes which require low energy ion bombardment such as surface cleaning. Ion sources are provided which have tapered magnetic pole pieces for controlling the dispersion pattern of the ion beam.

14 Claims, 7 Drawing Figures

$V_a$ is anode potentials,
$V_p$ is plasma potentials,
$\Delta V_i$ is voltage difference
for ion acceleration

HALL ION GENERATOR FOR WORKING SURFACES WITH A LOW ENERGY HIGH INTENSITY ION BEAM

This application is a continuation of application Ser. No. 584,304 filed Mar. 5, 1984, now abandoned; which is a continuation of application Ser. No. 383,919, filed June 1, 1982 now abandoned.

TECHNICAL FIELD

The present invention relates to integrated circuit fabrication techniques using ion beam bombardment of a substrate. Specifically, method and apparatus are provided for generating low energy, high intensity ion beams for various manufacturing processes of the integrated circuit art.

The working of substrate surfaces using ion bombardment is well known in the art. High energy ion bombardment of substrates in order to sputter atomic particles from a target has been successful to etch substrate surfaces. Alternatively, the sputtered particles may be deposited through a mask to form circuit components in a deposition process.

Typical ion beams used in these known processes are high energy, low density beams which because of their high kinetic energy upon impact with a substrate surface produce an undesirable space charge at the target surface. Various techniques have been employed to neutralize the space charge which interferes with normal ion bombardment of the substrate. These techniques employ the addition of neutralizing electrons to the ion beam for neutralizing the undesired space charge.

Prior art high current ion beam generators typically employ accelerator grids to extract the ions from a generator. The grids maintain an electrostatic charge which accelerates ions at the plasma sheath boundary towards the target. The grids themselves are however subject to sputtering from the escaping ions. The result is damage to the grids as well as the addition of impurities to the ion stream which are a source of contamination for the substrate. The grids are typically maintained at voltage potentials which accelerate only ions. The free charged particles, electrons in the case of a positive ion beam, which are available for neutralizing the ion beam, must be added to the ions after acceleration.

The presence of accelerator grids for producing the ion beam also imposes a well known limitation on the ion beam current capacity. By limiting the number of accelerator grids to one, such as is described in U.S. Pat. No. 4,259,145, and reducing the thickness of the accelerator grid, the current limitations can be partially offset. This unfortunately results in a very thin and hence fragile screen grid.

A further disadvantage of the higher energy ion beams is encountered during certain processes such as substrate cleaning when it is desirable to remove a thin oxide layer from the substrate before subjecting the substrate to bombardment. The higher energy beams will result in undesirable and excessive damage of underlying material during the oxide removing process step.

Other known techniques for generating an ion beam include the use of a plasma diode for generating low energy ion beams. This technique has the disadvantage of being located in close proximity to the surface being bombarded. Energetic electrons which sustain the plasma are capable of interacting with the surface being processed. Further, the trajectory of exiting ions is dependent on local surface variations of the sheath making control over the ion beam direction difficult.

SUMMARY OF INVENTION

It is a primary object of this invention to provide an apparatus and method for producing high intensity low energy ion beams for processing electronic component substrates.

It is a more particular object of this invention to produce high intensity, low energy ion beams which are self neutralized and which have a controlled beam width without utilizing accelerator grids.

These and other objects are accomplished by apparatus and methods in accordance with the invention. Low energy, high intensity ion beams are formed using a Hall current ion source. The resulting beam is used in certain process steps to remove oxides from a substrate, or effect reactive etching and direct deposition on certain types of substrates. The Hall current ion source produces either a diverging beam or focused beam depending upon the particular process application for the ion beam.

A Hall current ion source suitable for use in working the surfaces of electronic component substrates is provided with direct control over the generated ion beam. The ion source includes a plasma generator open at one end to emit low energy high intensity ions. First and second magnetic pole pieces are located inside the plasma generator. The magnetic pole pieces increase the collisions of gas molecules with high energy electrons generated by the anode and cathode elements of the plasma chamber. The field of the magnetic pole pieces also interact with an electron current to produce the electrostatic field that accelerates the ions. Additionally, the pole pieces are arranged at an acute angle with each other to form either a diverging or converging ion beam.

The ion beam generated by apparatus in accordance with the invention does not require an accelerator grid to provide an electrostatic field for accelerating the ions outside the plasma chamber thus avoiding the disadvantages inherent with gridded accelerators. Ion acceleration takes place near the exit aperture of the ion source due to the presence of a cathode element external to the exit aperture. The magnetic flux lines between pole pieces represent substantially equal potential contours in the acceleration region. Therefore, by selectively arranging the pole pieces at an angle with respect to each other, the magnetic lines between pole pieces establish controlled trajectories for ions accelerated under the influence of the external cathode.

DESCRIPTION OF THE PREFERRED EMBODIMENT

Figure 1A:
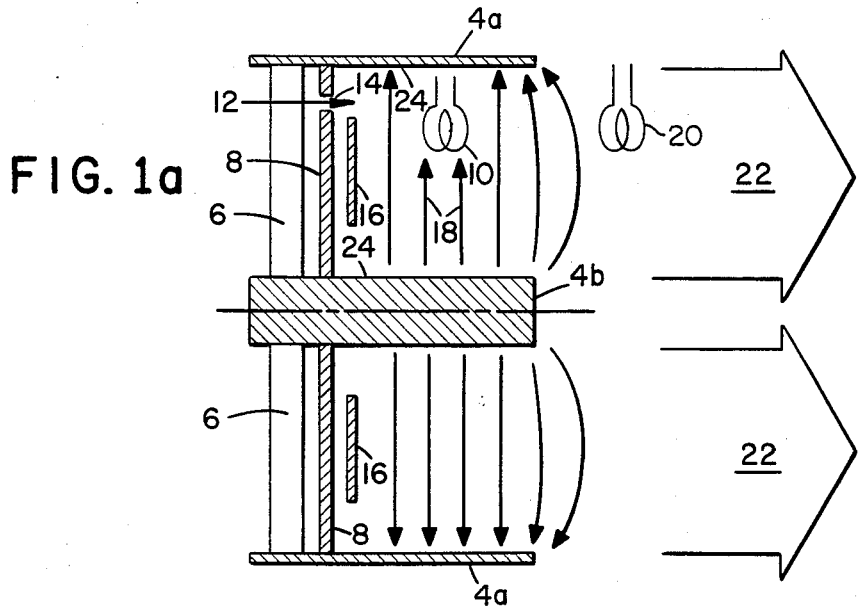
FIG. 1a is a sectional view of a conventional Hall ion source.

Referring now to FIG. 1a, there is shown a Hall current ion generator of the prior art. The generator 10 comprises an inner pole piece 4b and an outer pole piece 4a circumferentially enclosing the inner pole piece 4b. The pole pieces are in one embodiment a permeable material such as soft iron polarized by one or more magnets 6. A partition member 8 seals one end of the ion source and includes an aperture 14 for permitting an ionizing gas 12 such as argon to enter the chamber defined by the outer pole piece 4a. The opposite end of the ion chamber is open to permit ions formed within the chamber to exit.

Located within the chamber formed by circumferentially extending pole piece 4a is a circumferentially extending anode 16. Electrical connections are made to the anode 16 to permit a voltage potential to be applied thereto from outside the ion source.

Additional to the anode 16 is a cathode member 10 spaced apart from the anode 16 towards the exit opening of the ion source. The cathode 10 is similarly connected externally to a source of voltage potential more negative than the potential applied to anode 16.

Pole pieces 4b and 4a create magnetic lines of force 18 as shown in FIG. 1. Those lines of force near the exit end of the ion source extend in an arcuate manner between pole pieces.

Figure 2:
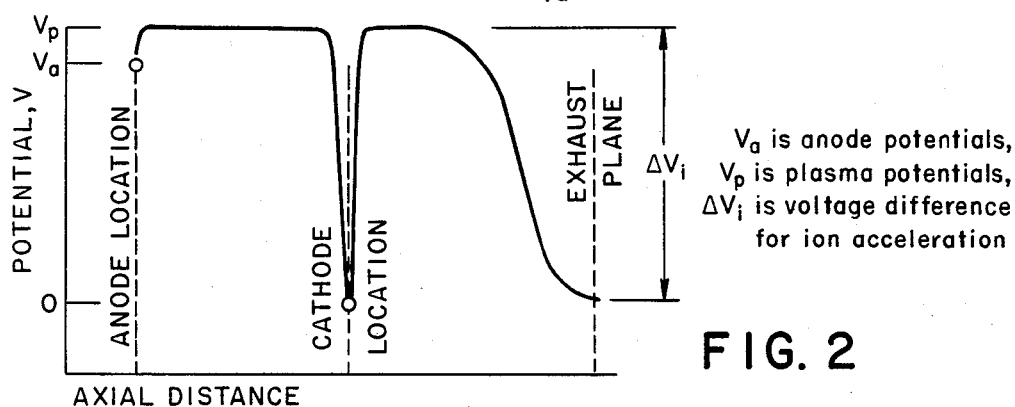
FIG. 2 is a graph demonstrating the voltage potential distribution within the Hall ion source.

Referring to FIG. 2, the potential profile within the ion source of FIG. 1a is shown. The anode is located at a positive potential Va and the cathode is at zero volts potential with respect to the anode potential. The voltage potential Va is typically 50 volts. A plasma is formed in a manner to be explained within the ion source and within the ion generation region near the anode it has a potential slightly positive of the anode potential.

The decrease in potential near the exit plane of the ion source is demonstrated in FIG. 2. The decrease in voltage potential, which provides for an ion acceleration zone, is provided for by an external filament 20 which may be maintained at the potential at cathode 10, or more negative up to several hundred volts negative of cathode 10. The cooperation of the magnetic field from pole pieces 4a and 4b with the electron current produced by filament 20, produces the required trajectories for ions exiting from the source and forming a beam 22. The shape of the magnetic field lines can be used to control the trajectory of the departing ions. Within the chamber the magnetic field lines are nearly radial and the acceleration tends to be axial in direction. Acceleration within the arcuate fringe field near the exit of the chamber results in more divergent ion trajectories.

Ion generation occurs within the ion generator as electrons which are emitted from the internal cathode 10 migrate towards the anode 16. The resulting plasma includes ions, low energy secondary electrons, and a few high energy primary electrons. The magnetic field produced within the ion source of FIG. 1 increases the path length of the migrating electrons whereby collisions between electrons and gas molecules are increased enriching the ion content of the plasma. Also produced as a result of the collisions between gas molecules and electrons emitted by the cathode 10 are low energy secondary electrons. The pressure within the ion source is maintained low at typically 1 mtorr. With the plasma potential typically several volts positive of the anode 16, the escape rate of electrons to the anode is at a rate consistent with the discharge current and ion beam current. In many applications, the cathode is maintained at approximately 30 to 50 volts negative of the anode.

The conductivity of the plasma within the Hall current source is much higher along the magnetic field lines than across them. Therefore, to a close approximation the magnetic field lines within the acceleration region represent equal potential contours and therefore determine the trajectories of the accelerated ions.

Local plasma potential in the ion beam 22 is determined by the cathode 20. The electrostatic field formed between the plasma near the anode 16 and cathode 20 is normal to the magnetic field, and ions escape under the influence of said electrostatic field in an axial direction away from the ion source. The filament 20 also emits electrons which move towards the anode 16. In moving toward the anode 16, interactions with the magnetic field will impart an azimuthal motion to the electrons emitted by filament 20. The azimuthal motion of the electrons which enter the plasma constitute a Hall current. The electron current from filament 20 to anode 16 places an additional current load on the voltage source between the two, thereby reducing the efficiency of the acceleration process. The added electrical power required do to the reduced efficiency is seldom a serious consideration in sputtering and deposition applications. Further, an ion source of the Hall current type produces ions which have a larger energy spread than results in other types of ions generators. However, in some of the applications to be discussed this energy spread is not of consequence. The cathode 20 also supplies neutralizing electrons to the ion beam.

The ion source of FIG. 1a used two cathodes 10, 20. It is possible to operate a Hall current ion source with only cathode 20. Ions are produced in this mode of operation from the cathode 20 becoming negative of anode 16 by more than the ionization potential.

Figure 1B:
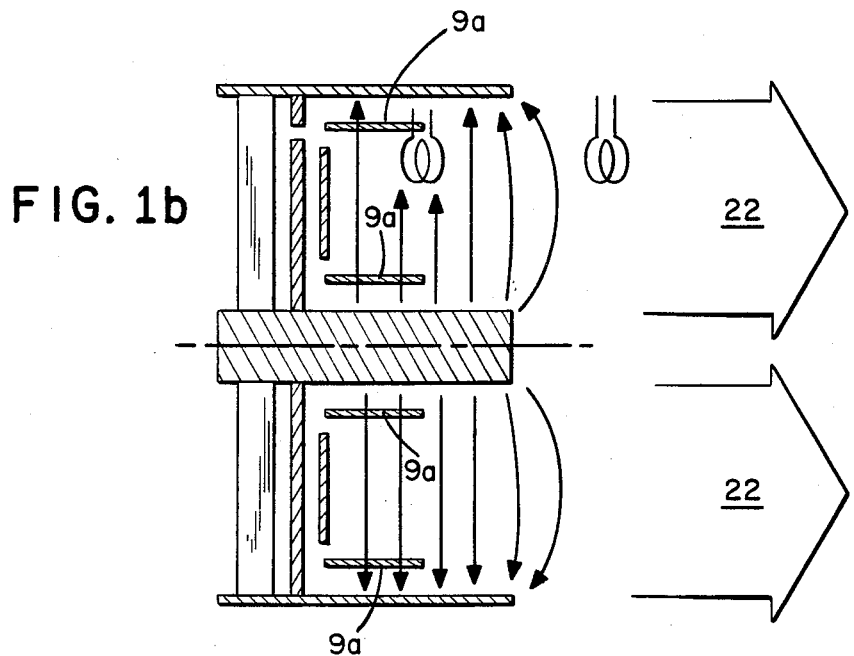
FIG. 1b is a sectional view of a hall source having an additional electrode for reducing sputtering damage.

Incidental to the ejecting of ions from the exit aperture of the ion source, are collisions with the surfaces 24 of the outer pole piece 4a and the center pole piece 4b. Both a loss of energetic ions and the sputtering of contamination particles occur as a result of these surface collisions. As is known to those skilled in the art, these collisions and the resulting sputtering of surfaces 24 can be reduced by the use of additional electrodes 9a, as indicated in FIG. 1b. The additional electrodes 9a are nonmagnetic, hence do not affect the magnetic field. The electrodes 9a do, however, serve to confine the ion generation to a portion of the chamber volume removed from surfaces 24. When the ions are accelerated in an axial direction, the probability of collision with surfaces 24 is therefore greatly reduced when electrodes 9a are used. The electrodes 9 are typically operated near the potential of cathode 10 to prevent the rapid escape of energetic electrons.

The aforesaid Hall current source can provide for a variety of industrial applications a high density, low energy beam of ions. The Hall current source can be used in processes for cleaning whereby thin layers of oxides and other materials may be removed from surfaces of workpieces with little or no sputtering of the underlying surface. Further, since the ion source does not require a grid at the exit aperture, contamination of the ion beam is maintained at a minimum level. Thus, the ion source for use as a neutralizer to introduce electrons into yet another ion beam is attractive because of the low contamination contained in the Hall current source produced ion beam.

In reactive etching techniques known to those skilled in the art, specific chemical compounds result when a specific reactive species of a particle is contained within the ion beam. Thus, the principal agent for removing particles is not through the use of high kinetic energy ions to bombard or sputter a surface, but is through a low kinetic energy ion beam which reacts with a surface thus, selectively working the surface. The use of a Hall current ion source provides for a high density beam of low energy ions which will not result in physical sputtering, but will permit the more selective reactive etching to take place.

Finally, the Hall current source is useful in direct deposition techniques where materials are deposited on a substrate from an incident ion beam. Deposition rates obtained in the prior art processes have been low due to the requirement that the ions have a low incident ion kinetic energy to avoid excessive sputter removal of previously deposited materials. The Hall current source has the ability to accelerate a high density current of low energy ions which avoids the sputter removal associated with other techniques which do not provide adequate control over the kinetic energy of incident ions.

Figure 3:
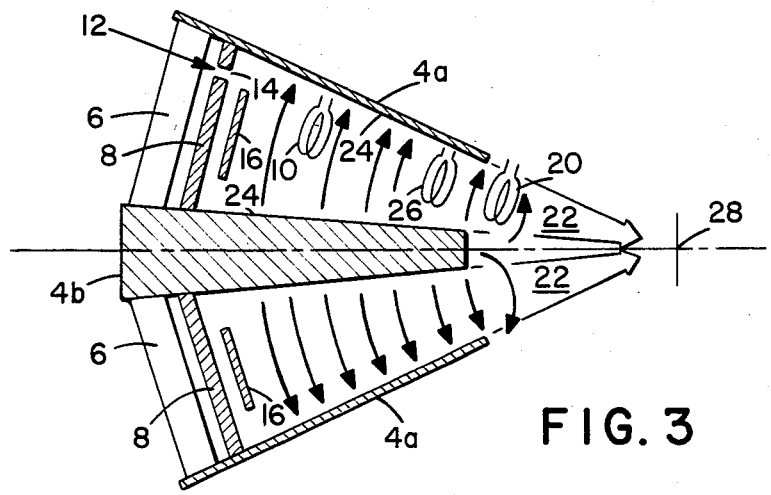
FIG. 3 is a sectional view of an ion source of one embodiment of the invention having a focused ion beam.

An apparatus in accordance with one embodiment of the invention which facilitates the use of the Hall current type ion source with these techniques is shown more particularly in FIG. 3. FIG. 3 represents an apparatus having a focusing arrangement for focusing a Hall current source ion beam on a specific target 28. As before, the Hall current ion source includes pole pieces 4a and 4b. However, the pole pieces 4a and 4b are conical and converge to a point which is coincident with the target substrate. Thus, the point of convergence identifies the focus point for the Hall current ion source of FIG. 3. The convergence of the ion beam results from the circular magnetic field lines produced by the conical pole pieces with a common vertex. The normal electrostatic field produced between cathode 20 and the plasma near the anode 16 will in cooperation with the circular magnetic field lines focus the ion beam at the vertex of the pole pieces 4a, 4b.

As in the previous ion source, there exists an aperture 14 for permitting entry of the gas to be ionized to the ion source. Cathodes 10 and anode 16 provide the necessary flow of electrons which under the influence of magnetic field 18 result in ion collisions with the gas molecules. Also as in the previous ion source, the conductivity of the plasma within the Hall current ion source is much higher along the magnetic field lines than across them. Therefore, to a close approximation the magnetic field lines within the acceleration region again represent equal potential contours and can therefore determine the trajectories of the accelerated ions. The magnetic field will produce some deflections of the ion trajectories, but this effect is usually small. By reducing the magnitude of the magnetic field strength, the acceleration efficiency will be reduced as a result of more diffusion of electrons from the external cathode 20 in a direction opposite to the ion acceleration path, but the secondary effects on the ion trajectories will also be reduced. Further, the truncation of the conical surfaces represented by the pole pieces 4a and 4b will influence the ion trajectories away from the ideal, i.e. convergence at the geometric point of convergence of pole pieces. The secondary effects of truncation on the trajectories of departing ions will, of course, depend on the extent of fringe field traversed by the ions near the truncations. In order to decrease even further the secondary effects of truncations on the trajectories, a third cathode 26 is inserted between cathodes 10 and 20. The region between cathode 26 and the exit aperture thereby becomes for the ions an equipotential drift space reducing the electron emission current required from cathode 20. Cathode 20 may remain in place as a source of neutralization particles for the ion beam. If cathode 20 is removed, neutralization, may still be accomplished by cathode 26 if the strength and extent of the magnetic field between cathodes 20 and 26 are not too large.

Figure 4:
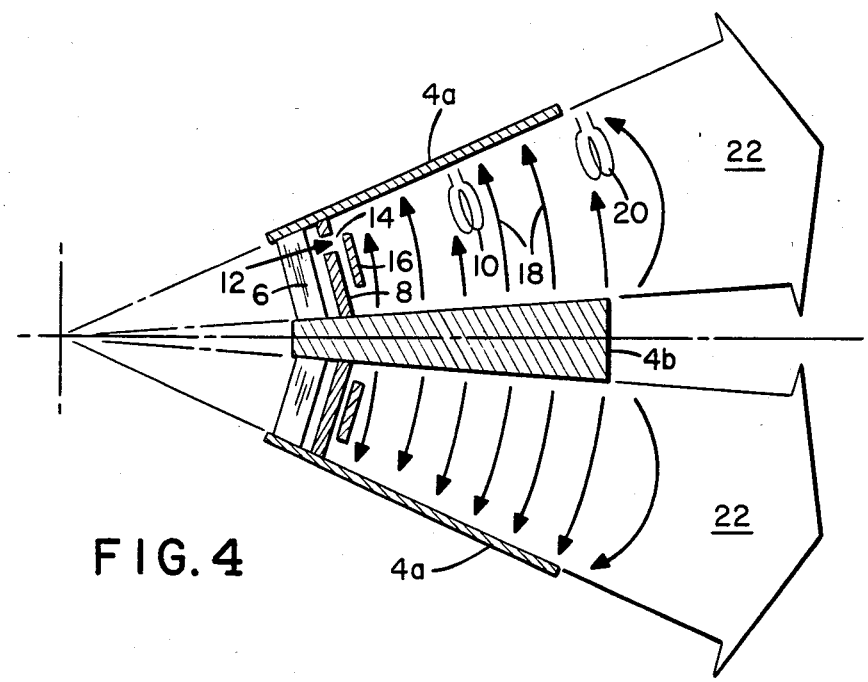
FIG. 4 is a sectional view of another embodiment of the invention wherein a diverging ion beam is formed.

FIG. 4 represents yet another embodiment of the invention for producing a diverging ion beam. In the configuration shown in FIG. 4, the exit aperture is defined by diverging pole pieces 4a and 4b. The generation of ions, and control of their trajectories is similar to the embodiment of FIG. 3. A divergent beam is desirable for many cleaning and deposition applications where it is necessary to cover a wide surface area. The converging beam is more appropriate for deposition applications in which the sputtering is produced from an intense ion beam on a small target area. The small target area permits reduced fixturing size and volume, and also permits the use of close spacings and high deposition rates.

Figure 5B:
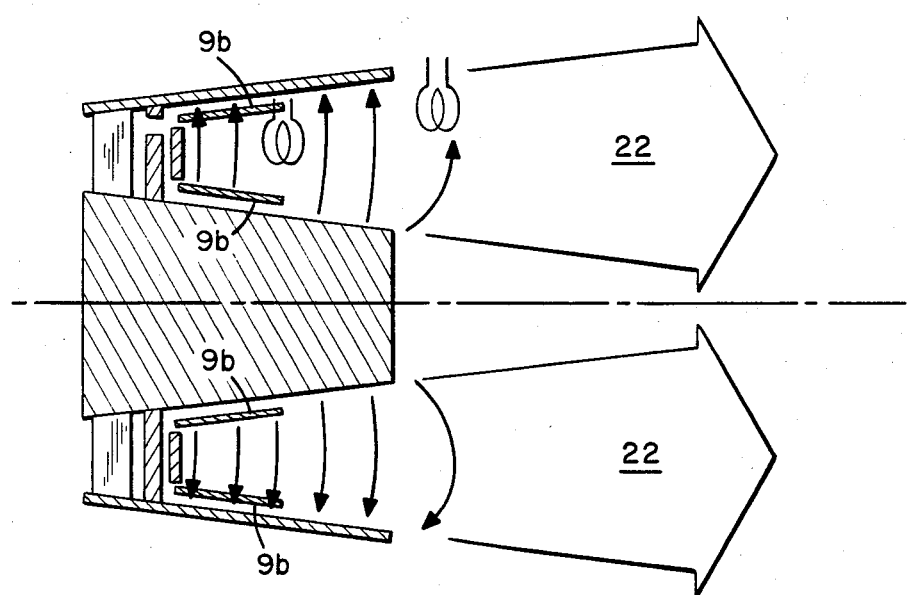
FIG. 5b illustrates the apparatus of FIG. 5a with additional electrodes for reducing sputtering damage.
Figure 5A:
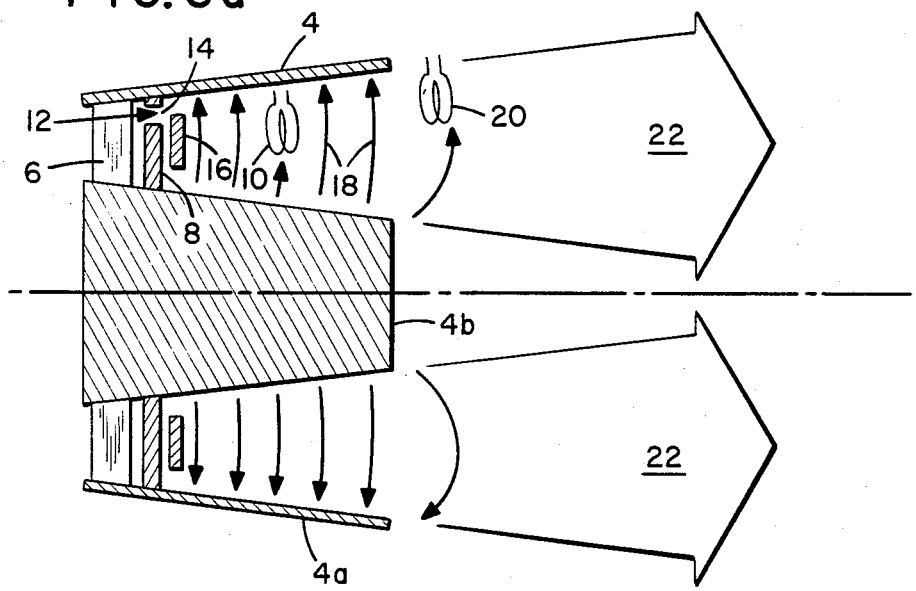
FIG. 5a is a sectional view of yet another embodiment of the invention wherein a diverging ion beam is formed.

FIG. 5a represents yet another embodiment of the invention, wherein a third category of ion beam coverage is obtained. With the center pole piece 4b constructed as shown as a cone, it is possible to obtain a more complete coverage at the expense of decreased uniformity for the ion current density. At a distance away from the ion source exit aperture, the beam spreads out sufficiently to include the axis of the source. However, the increased coverage near the axis is compromised by a decreased uniformity in the spread ion beam.

FIG. 5b demonstrates the use of additional electrode elements 9b for reducing the sputtering damage due to ion collisions with the magnetic pole pieces 4a, 4b. These additional electrode elements can, of course, be implemented in any of the embodiments described herein.

Thus, a number of applications for Hall ion sources have been described, as well as several distinct configurations of Hall ion sources which will facilitate the generation and use of Hall source ion beams in manufacturing processes. Those skilled in the art will recognize yet other embodiments of the invention more particularly described by the claims that follows.

Having thus described my invention, what I claim as new, and desire to secure by Letters Patent is:

1. In a system for working the surface of electronic circuit substrates, a low energy, high intensity ion source comprising:

a plasma chamber receiving at one end thereof a gas for ionizing, and open at another end to deliver ions; said chamber including an anode, and an external electron emitting cathode adjacent said open end exterior to said chamber for receiving a voltage potential, whereby a current flow of electrons between said cathode and anode is generated;

a first magnetic pole piece having an interior surface forming an interior circumferential surface of said chamber; and a second magnetic pole piece extending along a longitudinal axis of said plasma chamber, said pole pieces forming an interior magnetic field for increasing the production of ions within said chamber, said first magnetic pole piece forming an interior angle with said second pole piece, said magnetic pole pieces producing an arcuate fringe field at said open end, said anode and cathode forming an accelerating electrostatic field therebetween along an axis of said plasma chamber to said open end, whereby ions exiting said plasma generator are formed in a predetermined beam pattern determined by said angle as a result of said electrostatic field and magnetic field.

2. In a system for working substrates of an electronic component, a low energy, high intensity ion source comprising:

a plasma chamber receiving at one end thereof a gas for producing ions, and having an exit aperture for emitting ions;

first and second electrodes, one of said electrodes located within said chamber, the remaining of said electrodes located external of said chamber for emitting electrons which migrate to said one electrode, said electrodes receiving a voltage potential for producing a plasma within said chamber;

said plasma chamber including a central longitudinal extending pole piece and a circumferentially extending pole piece, said circumferentially extending pole piece forming an acute angle with said central pole piece, said pole pieces extending from said one end to said exit aperture in said plasma chamber, said electrodes forming an electrostatic accelerating field therebetween for accelerating ions through said exit aperture and magnetic field, said electrostatic field and magnetic field cooperating to produce a stream of ions having a beam pattern substantially controlled by said acute angle.

3. The ion source of claim 2, wherein a third electrode is included in said plasma chamber.

4. The ion source of claim 3, wherein said third electrode comprises a cathode for connection with a source of voltage potential.

5. The ion source of claim 2 wherein said pole pieces diverge towards said open end forming a diverging ion beam.

6. The ion source of claim 2 wherein said pole pieces converge towards said open end forming a focussed ion beam.

7. In a system for working the surface of an electronic component substrate, a low energy, high intensity ion source comprising:

a plasma chamber having an outer circumferential housing comprising a first magnetic pole piece tapered from a first closed end towards an opposite open end for emitting a beam of ions, said plasma chamber including an opening for receiving an ionizing gas;

an anode adjacent said first closed end and said gas emitting opening;

at least one electron emitting cathode located adjacent said opposite end external to said chamber for producing a plasma in response to a voltage potential between said anode and cathode, said cathode and anode producing an accelerating electrostatic field extending therebetween through said open end;

a second magnetic pole piece extending along said plasma chamber for establishing a magnetic field with said first pole piece for enhancing ion production by increasing the path length for electrons emitted by said cathode, said second pole piece being centrally located, with magnetic field lines between the pole pieces forming substantially equal potential contours substantially normal to said accelerating electrostatic field, whereby ions leaving said plasma chamber through said opposite end are formed in a beam having a dimension controlled by said housing taper.

8. The ion source of claim 7 further including second and third cathode elements located within said magnetic pole pieces.

9. In a system for working the surface of an electronic component substrate, a low energy, high intensity ion source comprising:

a plasma chamber having a magnetic circumferential pole piece diverging from a first closed end towards a second, ion emitting end, said first end including a gas emitting aperture;

a second tapered magnetic pole piece located along the axis of said circumferential pole piece, said pole piece having a narrower end adjacent said second ion emitting end, and a wider end adjacent said first end;

an anode located adjacent said first end; and, at least one electron emitting cathode located outside of said ion emitting second end; said anode and cathodes adapted to receive a voltage potential producing a current flow from said cathode to said anode, whereby an electrostatic acceleration field extending between said anode and cathode is produced extending through said ion emitting second end;

said pole pieces diverging away from each other towards said second ion emitting end, forming a magnetic field of substantially equal potential contours substantially normal to said acceleration field, whereby ions formed within said chamber form a diverging ion beam exiting from said second ion emitting end.

10. The ion source of claim 9 further including a second cathode element located within said chamber.

11. The ion source of claim 9 wherein said anode element circumferentially encloses said first magnetic pole piece adjacent said first end.

12. In a system for working the surface of electronic circuit substrates, low energy, high intensity ion source comprising:

a plasma chamber for receiving an ionizing gas, said chamber including a circumferentially extending first pole piece, open at one end, said pole piece being tapered between said one end and a remaining closed end;

a second longitudinal pole piece extending along the central axis of said first pole piece;

an anode element located between said pole pieces;

an electron emitting cathode element located adjacent said first pole piece open end, whereby said gas is ionized in response to a voltage difference between said anode and cathode, and an accelerating electrostatic field extending between said anode and cathode is formed extending through the plasma chamber open end, said pole pieces forming arcuate magnetic lines of force in said accelerating electrostatic field, whereby an ion beam exits said plasma chamber open end forming a beam pattern determined by the taper of said first pole piece.

13. The Hall current ion source of claim 12 further comprising a circumferential electrode spaced apart and concentric to said first pole piece, said electrode reducing the ion collisions with said first pole piece.

14. The Hall current ion source of claim 12 comprising a second electrode for enclosing a portion of said second pole piece wherein ion collisions with said second pole piece are reduced.

* * * * *

UNITED STATES PATENT AND TRADEMARK OFFICE
CERTIFICATE OF CORRECTION

PATENT NO. : 4,541,890

DATED : September 17, 1985

INVENTOR(S) : Cuomo et al

It is certified that error appears in the above-identified patent and that said Letters Patent is hereby corrected as shown below:

In the title, the word "intensity" should be --density--.

In column 1, line 15, "intensity" should be --density--.

In column 2, lines 8 and 30, intensity" should be --density--.

In column 6, claim 1, line 2, "intensity" should be --density--.

In column 7, claim 2, line 1, "substrates" should be --the surface--; on line 2, after "component" insert --substrates; "intensity" should be --density--.

In column 7, claim 7, line 2, "intensity" should be --density--.

In column 8, claim 9, line 2, "intensity" should be --density--.

In column 8, claim 12, line 3, "intensity" should be --density--.

Signed and Sealed this

Twenty-fourth Day of June 1986

[SEAL]

Attest:

DONALD J. QUIGG

Attesting Officer

Commissioner of Patents and Trademarks